(12) United States Patent
Spanier et al.

(10) Patent No.: US 9,178,131 B2
(45) Date of Patent: Nov. 3, 2015

(54) FERROELECTRIC NANOSHELL DEVICES

(71) Applicant: Drexel University, Philadelphia, PA (US)

(72) Inventors: Jonathan E Spanier, Bala Cynwyd, PA (US); Stephen S Nonnenmann, Philadelphia, PA (US); Oren David Leaffer, Philadelphia, PA (US)

(73) Assignee: Drexel University, Philadelphia, PA (US)

( * ) Notice: Subject to any disclaimer, the term of this patent is extended or adjusted under 35 U.S.C. 154(b) by 0 days.

(21) Appl. No.: 14/176,315

(22) Filed: Feb. 10, 2014

(65) Prior Publication Data

US 2014/0152377 A1    Jun. 5, 2014

Related U.S. Application Data

(62) Division of application No. 13/131,994, filed as application No. PCT/US2009/066335 on Dec. 2, 2009, now Pat. No. 8,704,204.

(60) Provisional application No. 61/119,306, filed on Dec. 2, 2008.

(51) Int. Cl.
| | |
|---|---|
| *H01L 43/02* | (2006.01) |
| *B82Y 10/00* | (2011.01) |
| *H01G 4/008* | (2006.01) |
| *H01G 4/12* | (2006.01) |
| *H01G 4/33* | (2006.01) |
| *H01L 29/06* | (2006.01) |
| *H01L 27/02* | (2006.01) |
| *H01L 49/02* | (2006.01) |

(Continued)

(52) U.S. Cl.
CPC ............. *H01L 43/02* (2013.01); *B82Y 10/00* (2013.01); *H01G 4/008* (2013.01); *H01G 4/1209* (2013.01); *H01G 4/33* (2013.01); *H01L 27/0214* (2013.01); *H01L 28/40* (2013.01); *H01L 29/068* (2013.01); *H01L 29/0665* (2013.01); *H01L 29/0673* (2013.01); *H01L 29/66977* (2013.01); *H01L 29/775* (2013.01); *H01L 29/78391* (2013.01); *H01L 21/28291* (2013.01); *H01L 29/6684* (2013.01)

(58) Field of Classification Search
CPC .................................................. H01L 27/0214
See application file for complete search history.

(56) References Cited

U.S. PATENT DOCUMENTS

| | | |
|---|---|---|
| 6,858,862 B2 | 2/2005 | Li et al. |
| 7,147,834 B2 | 12/2006 | Wong et al. |

(Continued)

OTHER PUBLICATIONS

Luo et al., "Nanoshell Tubes of Ferroelectric Lead Zirconate Titanate and Barium Titanate", Applied Physics Letters, Jul. 21, 2003, 83(3), 440-442.

(Continued)

*Primary Examiner* — Yu-Hsi D Sun
*Assistant Examiner* — Ankush Singal
(74) *Attorney, Agent, or Firm* — Baker & Hostetler LLP

(57) ABSTRACT

Disclosed herein are nanoscale devices comprising one or more ferroelectric nanoshells characterized as having an extreme curvature in at least one spatial dimension. Also disclosed are ferroelectric field effect transistors and metal ferroelectric metal capacitors comprising one or more ferroelectric nanoshells. Methods for controlling spontaneous ferroelectric polarization in nanoshell devices are also disclosed.

20 Claims, 7 Drawing Sheets

(51) Int. Cl.
*H01L 29/775* (2006.01)
*H01L 29/78* (2006.01)
*H01L 21/28* (2006.01)
*H01L 29/66* (2006.01)

(56) References Cited

U.S. PATENT DOCUMENTS

| | | |
|---|---|---|
| 2003/0089899 A1* | 5/2003 | Lieber et al. .................. 257/9 |
| 2004/0256649 A1 | 12/2004 | Andideh |
| 2005/0247965 A1 | 11/2005 | Andideh |
| 2007/0048514 A1 | 3/2007 | Rockford |
| 2007/0176218 A1 | 8/2007 | Kang |
| 2008/0224123 A1 | 9/2008 | Martin et al. |
| 2009/0057737 A1* | 3/2009 | Boescke et al. ............... 257/295 |
| 2009/0095950 A1* | 4/2009 | Lieber et al. .................. 257/4 |

OTHER PUBLICATIONS

PCT Application No. PCT/US2009/66335: International Search Report and Written Opinion of the International Searching Authority, Mar. 3, 2011, 9 pages.

Scott et al., "Ferroelectric Thin-Film Devices: Failure Mechanisms and New Prototype Nano-Structures", Sixteenth IEEE International Symposium on Applications of Ferroelectrics, 2007, ISAF 2007, Nov. 29, 2007, 4 pages.

* cited by examiner

FIG. 5(a)
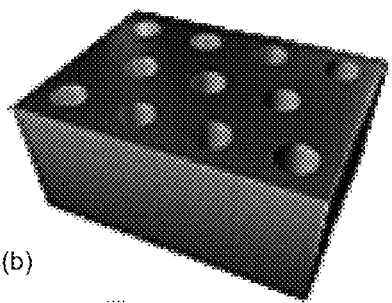
FIG. 5(b)
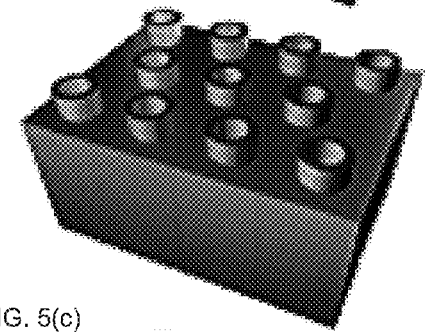
FIG. 5(c)
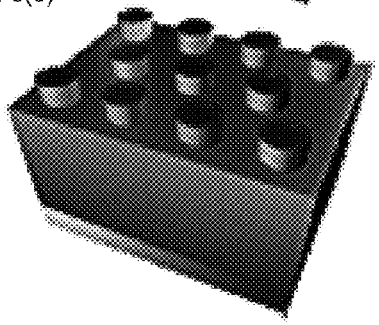
FIG. 5(d)
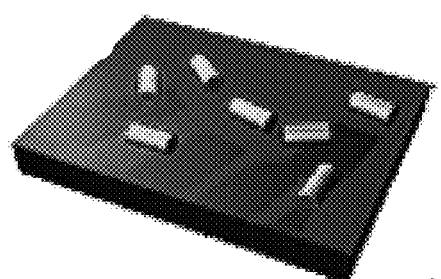
FIG. 5(e)
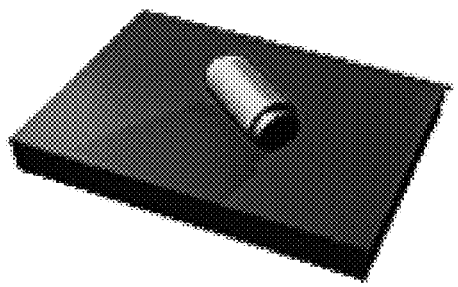
FIG. 5(f)
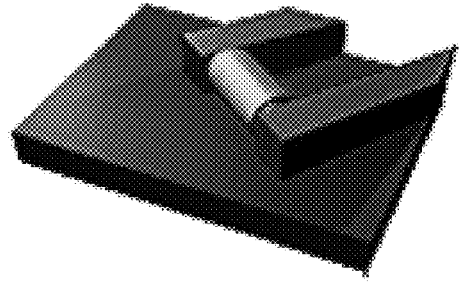
FIG. 5

US 9,178,131 B2

FERROELECTRIC NANOSHELL DEVICES

CROSS REFERENCE TO RELATED APPLICATIONS

This application is a Divisional application of co-pending U.S. application Ser. No. 13/131,994 filed Sep. 14, 2011, which is the National Stage of International Application No. PCT/US2009/066,335, filed Dec. 2, 2009, which claims the benefit of U.S. Provisional Patent Application Ser. No. 61/119,306 filed Dec. 2, 2008. All of the foregoing applications are incorporated by reference in their entireties for any and all purposes.

STATEMENT OF GOVERNMENT SUPPORT

The work leading to the disclosed inventions was funded in whole or in part with federal funds from the U.S. Army Research Office under Contract No. W911NF-08-1-0067. Accordingly, the U.S. Government has rights in these inventions.

TECHNICAL FIELD

The disclosed inventions are generally in the field of nanoscale devices and the fields of ferroelectric and ferromagnetic materials and devices.

BACKGROUND

It is well known that some ferroelectric materials exhibit dielectric, piezoelectric, electrorestrictive, pyroelectric and electro-optic properties that may be useful for nanoscale devices, including memory devices and electro optical devices. Ferroelectric materials are characterized by spontaneous and remnant polarization and hysteresis in the polarization, which give rise to some of these properties. For example, polarization in ferroelectric materials may be effected by subjecting them to an electric field.

This change in polarization may be used for storing binary information, or in optical devices, changes in polarization may give rise to changes in the refractive index of the material.

Planar film ferroelectrics have undergone a significant amount of research for use in electronics, memory and electro optical applications. This research has been focused in large part on their use in thin-film ferroelectric capacitors. In some cases, planar film ferroelectrics have been explored for making random access memory (RAM), field effect transistor (FET), and electro optical devices. In general, planar film ferroelectrics suffer from a lack of scalability, leakage, large power consumption and volatility in their application.

The depolarizing field within ferroelectric materials that arises from incomplete screening is known to be principal source of ferroelectric instability in thin films and nanostructures. The depolarizing field is believed to give rise to an evolution of ferroelectric polarization P and ferroelectric phase transition temperature T with finite size. Although reducing film thickness may decrease polarization, reduced film thickness poses significant difficulty for retaining memory storage capacity. Reduced film thicknesses have also given rise to problems in memory storage devices associated with current leakage, power consumption and non-volatile operation.

Thus, there remains a need for ferroelectric devices with increased scalability, low leakage, low power consumption and non-volatile operation.

SUMMARY

In overcoming the challenges associated with thin film ferroelectric devices, The present invention provides, inter alia, nanoscale devices comprising: one or more electrodes; and one or more nanoshells comprising a ferroelectric material, the one or more nanoshells being characterized as comprising: an inner nanoshell surface having a radius of curvature in the range of from about 3 nm to about 300 nm; and an outer nanoshell surface having a radius of curvature in the range of from about 5 nm to about 500 nm, a thickness between said inner nanoshell surface and said outer nanoshell surface in the range of from greater than about 1 nm to less than about 100 nm; and wherein at least one of the nanoshell inner or outer surfaces is situated adjacent to the one or more electrodes; and wherein the ferroelectric material is characterized as being ferroelectric, ferromagnetic, or both.

Also provided herein are ferroelectric field effect transistors comprising: a source; and a drain, wherein said source and drain are capable of providing an electric field to a ferroelectric nanoshell; and a gate, wherein the gate is disposed on the ferroelectric nanoshell; and one or more nanoshells comprising a ferroelectric material, the one or more nanoshells being characterized as comprising an inner nanoshell surface having a radius of curvature in the range of from about 3 nm to about 300 nm; and an outer nanoshell surface having a radius of curvature in the range of from about 5 nm to about 500 nm, and a thickness between said inner nanoshell surface and said outer nanoshell surface in the range of from greater than about 1 nm to less than about 100 nm; wherein the ferroelectric nanoshell is characterized as being ferroelectric, ferromagnetic, or both.

Metal ferroelectric metal capacitors are also provided comprising: two or more electrodes; and one or more nanoshells comprising a ferroelectric material, the one or more nanoshells being characterized as comprising an inner nanoshell surface having a radius of curvature in the range of from about 3 nm to about 300 nm; and an outer nanoshell surface having a radius of curvature in the range of from about 5 nm to about 500 nm, a thickness between said inner nanoshell surface and said outer nanoshell surface in the range of from greater than about 1 nm to less than about 100 nm; and wherein the nanoshell inner and outer surfaces are situated adjacent to the two or more electrodes; and wherein the ferroelectric material is characterized as being multiferroic.

Also provided herein are method for controlling spontaneous ferroelectric polarization in a nanoshell device comprising: providing a nanoshell comprising the following characteristics: an inner nanoshell surface having a radius of curvature in the range of from about 3 nm to about 300 nm; and an outer nanoshell surface having a radius of curvature in the range of from about 5 nm to about 500 nm; and a thickness between said inner nanoshell surface and said outer nanoshell surface in the range of from greater than about 1 nm to less than about 100 nm, wherein the ferroelectric nanoshell is characterized as being ferroelectric, ferromagnetic, or both, and applying a voltage via one or more electrodes to switch the spontaneous ferroelectric polarization of the nanoshell device.

Generally, ferroelectric nanoshells may be of any geometry wherein the above thickness and inner and outer radii of curvature of the shell are satisfied. In an aspect of ferroelectric nanoshell devices, the topography, such as curvature in thin films of ferroelectrics may improve the polarization field in the radial direction from the radius of curvature. The magnitude of this polarization field may be much larger than some models predicted, and the polarization field may also be larger than the polarization fields of planar ferroelectrics of similar thicknesses in the nanoscale.

Ferroelectric nanoshells may have at least one electrode capable of inducing an electric field and polarization state in the device. The polarization state induced by the electric field may be switchable and may allow for a number of nanoscale devices such as a capacitor, a ferroelectric field effect transistor and an electro optical device. Other devices may benefit from the small scale and polarization properties of ferroelectric nanoshell devices.

Tests to determine the relationship between radial thickness and radial ferroelectric polarization on these devices showed much weaker correlation than that found for thickness and polarization in planar films. Thus, in one aspect of the present invention, the thickness of the shell of the ferroelectric is scalable down to the nanoscale and sub nanoscale region.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIGS. 5(a)-5(f) depict a process for fabrication of ferroelectric tubes; and

Figure 1:
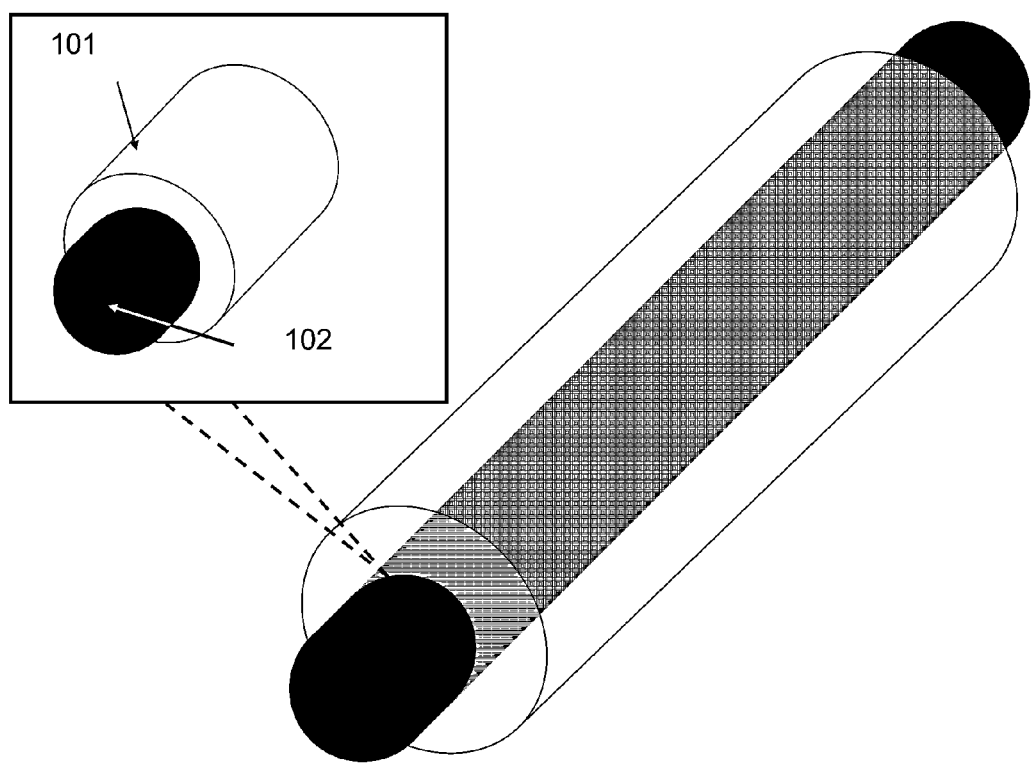
FIG. 1 depicts a nanowire or nanotube geometry for a nanoshell device.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

DETAILED DESCRIPTION OF ILLUSTRATIVE EMBODIMENTS

Terms

As used herein, "nanoscale" generally refers to dimensions in the range of from about 1 nm to about 100 nm.

As used herein, "nanoshell" generally refers to a nanoscale device comprised of ferroelectric material having at least two curved surfaces. The inner curved surface having a radius of curvature of from about 3 nm to about 300 nm, the outer curved surface having a radius of curvature of from about 5 nm to about 500 nm. The inner and outer surfaces having a distance between them of from about 1 nm to about 100 nm.

As used herein, "ferroelectric" means a composition that exhibits ferroelectric properties. Ferroelectric properties may include, among other things, exhibiting spontaneous ferroelectric polarization and relaxor polarization. Spontaneous ferroelectric polarization and relaxor polarization may include remnant polarization, wherein after the removal of a first electric field the state of polarization remains. The polarization state induced by application of a first electric field may be reversible by application of a second external electric field.

As used herein, "ferromagnetic" means any material that can exhibit spontaneous magnetization.

As used herein, "spontaneous magnetization" means any material that can exhibit a net magnetic moment in the absence of an external magnetic field.

As used herein, "solid solution" means at least two elements may comprise a molecular site determined by material percent composition.

As used herein, "ferroic" means ferromagnetic, ferroelectric, and ferroelastic. Ferroic materials exhibit large changes in physical characteristics over short temperature ranges. The changes in physical characteristics occur when phase transitions take place around some critical temperature value, the Curie temperature, normally denoted by $T_c$. Above this critical temperature, the crystal is in a nonferroic state and exists with no notable physical characteristics. Upon cooling the material down below $T_c$ it undergoes a spontaneous phase transition. These phase transitions result in only small deviations from the nonferroic crystal structure, but in altering the shape of the unit cell the point symmetry of the material is reduced. Without being limited by any particular theory of operation, it is believed that this breaking of symmetry physically allows the formation of the ferroic phase.

As used herein, "ferroelastic" means a material that exhibits spontaneous strain. When a stress is applied to a ferroelastic material, a phase change will occur in the material from one phase to an equally stable phase either of different crystal structure (e.g. cubic to tetragonal) or of different orientation. This stress-induced phase change results in a spontaneous strain in the material.

As used herein, "multiferroic" means a material that exhibits more than one primary ferroic order parameter simultaneously (i.e., in a single phase). Primary ferroic order parameters are ferromagnetism, ferroelectricity and ferroelasticity.

As used herein, "nanocylinder" means a cylinder or substantially cylindrical, wherein the distance between the inner curved surface of the cylinder and the outer curved surface of the cylinder is in the nanoscale. The length of a nanocylinder in the non-radial direction may be any length in the range of from about 5 nm to about 1 mm, or from 6 nm to 500 um, or from 7 nm to 100 um, or from 8 nm to 10 um, or from about 8 nm to about 1 um.

As used herein, "nanodot" means a nanoshell that has an area that is substantially hemispheric or substantially semi-ellipsoidal. The substantially hemispheric or substantially ellipsoidal part of the nanoshell having a thickness in the nanoscale.

As used herein "nanowire" means a nanoshell having an inner curved surface wherein the distance between the inner curved surface and an outer curved surface is nanoscale. Nanowires disclosed herein are generally comprised of a ferroelectric material and have a substantially coaxial component made of a second material. A nanowire may be of length of from about 5 nm to about 1 mm, or from 6 nm to 500 um, or from 7 nm to 100 um, or from 8 nm to 10 um, or from about 8 nm to about 1 um.

As used herein, "metal ferroelectric metal" generally refers to a layered structure comprising a ferroelectric layer sandwiched between two metal layers.

As used herein, "spontaneous ferroelectric polarization" generally refers to a material that is capable of switching into a particular ferroelectric polarization state. Spontaneous ferroelectric polarization may include remnant polarization, which means a polarization state that is maintained without the application of an external field.

As used herein, "relaxor ferroelectrics" means materials that do not exhibit spontaneous polarization, but that exhibit remnant polarization when they are cooled in the presence of an electric field.

As used herein, "radius of curvature" as applied to nanoshells is generally measured by the distance from the center of a sphere or ellipsoid to its surface is its radius. The radial distance described at points along the nanoshells surface is its radius of curvature. With a sphere, the radius of curvature equals the radius. With an oblate ellipsoid however, not only does it differ from the radius, but it varies, depending on the direction being faced.

As used herein, "nanohole" means a nanoshell indented into a substrate or electrode that has an area that is substantially hemispheric or substantially semi-ellipsoidal. The substantially hemispheric or substantially ellipsoidal part of the nanoshell having a thickness in the nanoscale.

Suitable nanoshells can generally have any thickness at the nanoscale. Accordingly, suitable nanoshells have a thickness in the range of from about 1 nm to about 100 nm, or from 2 nm to 50 nm, or from 3 nm to 40 nm, or from 4 nm to 30 nm, or from 5 nm to 25 nm, or from about 6 nm to about 20 nm.

Suitable nanoshells are composed of a ferroelectric material, as further defined below.

Suitable nanoshells have inner and outer surfaces. The inner surface suitably has a radius of curvature in the range of about 3 nm to about 300 nm, or even 4 nm to about 200 nm, or about 5 nm to about 150 nm, or even 6 nm to about 100 nm. Likewise, the outer surface suitably has a radius of curvature in the range of about 5 nm to about 500 nm, or even 6 nm to 400 nm, or 7 nm to 300 nm, or even 8 nm to 200 nm.

FIG. 1 depicts an example geometry for a nanoshell. A thin film of ferroelectric 101 as defined below is depicted as comprising a nanotube. The curved surface in this geometry is situated coaxially with at least one electrically contacted electrode 102, the curved surface having the inner and outer radius limitation mention above. Generally, a nanoshell may be of any geometry wherein one or more thin film layers of ferroelectric material are placed in a suitable configuration as described below. FIG. 1 and the other drawings serve merely to provide examples of possible geometries and do not limit the geometry of the devices.

Figure 2:
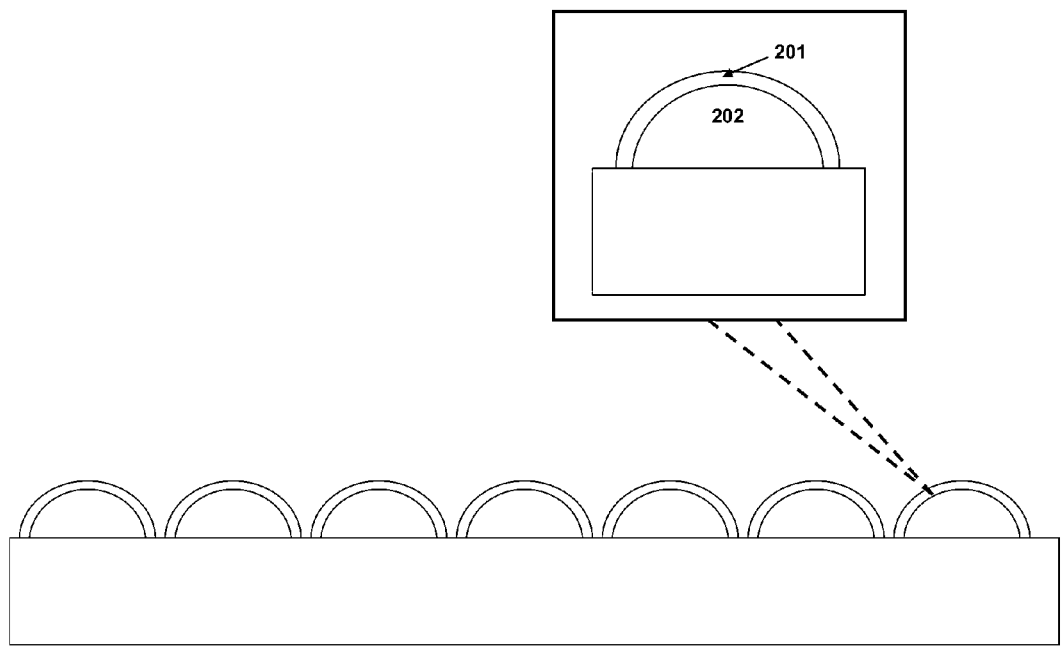
FIG. 2 depicts a nanodot, nano-hemisphere or nano semi-cylinder geometry for a nanoshell device.

FIG. 2 depicts a second example geometry for a nanoshell device. A thin film of ferroelectric material as defined below 201 is depicted adjacent to at least one electrically contacted electrode 202, and in this depiction, the film is disposed on 203. 203 may represent an electrode, the composition of which is defined below, or a substrate. FIG. 2 depicts a cross section, which may be a representation of a semi-cylinder, a semi-tube, a hemisphere, or any sort of nanodot. This drawing serves merely to provide an example of the present device and does not limit the geometry in any way.

Figure 3:
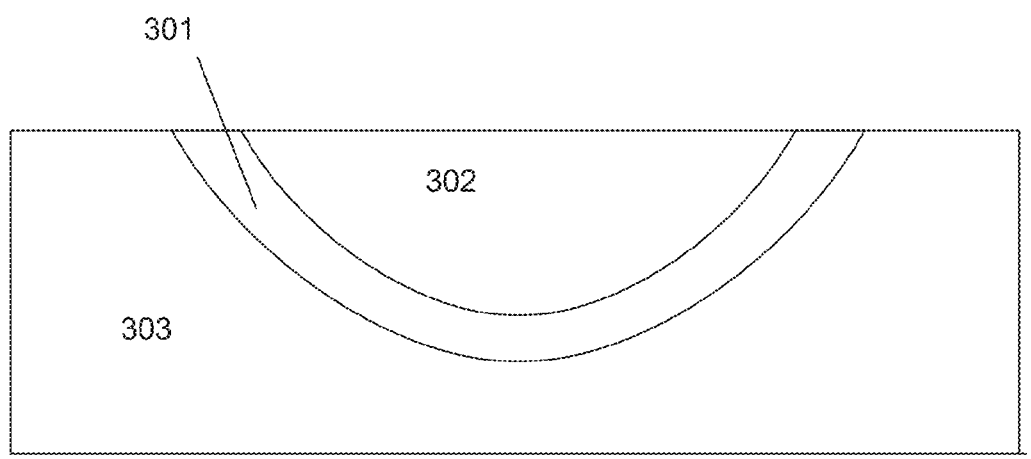
FIG. 3 depicts a nano-hole, nano-trench or nano-indentation geometry for a nanoshell device.

FIG. 3 depicts a third example geometry for a nanoshell device. A thin film of ferroelectric material 301 as defined below is depicted electrically contacted with least one electrode, for example 302 or 303. This depiction is a cross section, which may be a representation of a semi-cylindrical groove or trench, a hemispherical indentation, a nanohole or any other suitable indentation in an electrode 303 or substrate 303 having sufficient curvature as defined below. In FIG. 3, 303 may be a substrate or an electrode.

Figure 4:
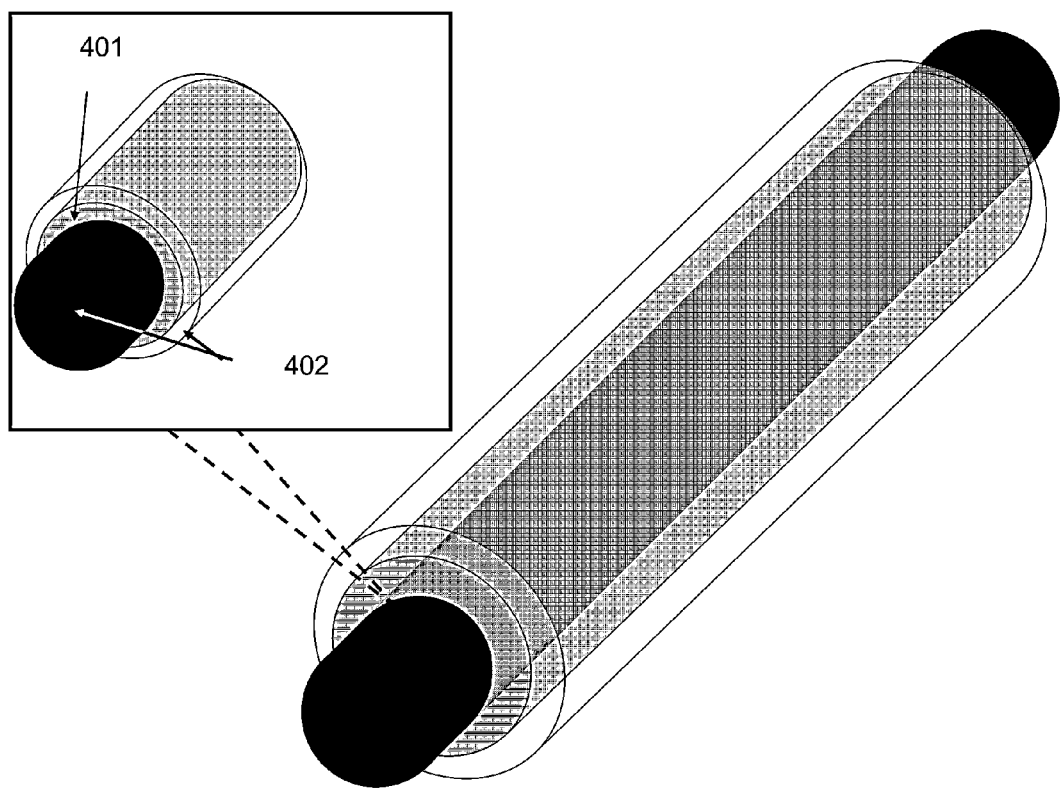
FIG. 4 depicts a nanowire or nanotube geometry for a nanoshell device.

FIG. 4 depicts a fourth example geometry for a nanoshell device. A thin tube of ferroelectric material 401 as defined below is depicted sandwiched between two coaxial electrodes 402. These electrodes may be electrically contacted with the ferroelectric nanoshell.

A nanoshell device may have any geometry where one or more layers of ferroelectric material 101, 201, 301, 401 have a curved surface with an inner radius of curvature of from about 3 nm to about 300 nm. The outer surface characterized as having a radius of curvature of about 5 nm to about 500 nm. The device may have any suitable geometry including a nanotube, a nanodot, a nanohole, a cylinder, a rod or wire, an ellipse or a sphere.

As used herein, a nanoshell may have one or more alternating layers of ferroelectric material as described below layered on each other wherein the combined thickness of the ferroelectric layers is not less than about 1 nm, and not more than about 100 nm, or not less than 2 nm to not greater than 50 nm, or not less than 3 nm to not greater than 40 nm, or not less than 4 nm to not greater than 30 nm, or not less than 5 nm to not greater 25 nm, or from about 6 nm to about 20 nm.

Appropriate ferroelectric materials used in the nanoshells may be any material exhibiting spontaneous ferroelectric polarization and any relaxor ferroelectrics. These materials may be semiconductor ferroelectrics, organic ferroelectrics, polymer ferroelectrics or perovskite ferroelectrics, represented in the general form of form of $ABO_3$, or $A_{1-x}A'_x B_{1-y}B'_y O_3$. A and A' may represent any element in the lanthanide, alkaline earth, alkali metal groups and B and B' may represent a transition metal. Suitable values for x and y are any number between 0 and 1. The ferroelectric nanoshell structure may include ferroelectric compositions, ferromagnetic compositions, or both.

According to certain features of the devices, the ferroelectric material may be capable of switching between two or more polarization states. These states may be switchable by the introduction of an electric field via one or more electrodes that are electrically contacted with the ferroelectric material. Certain embodiments of the present device will have ferroelectric that, upon switching from a first polarization state to a second polarization state, maintains that polarization state without requiring continued application of an electric field to the device.

As used herein, an electrode may comprise one or more conducting or semiconducting materials disposed on at least one of the inner and outer surfaces of the nanoshells. Electrodes may be composed of any noble metal, transition metal, transition metal alloy, semiconducting material or non-ferroic perovskite oxides. Suitable noble metals for use as electrodes include rhenium, ruthenium, rhodium, palladium, silver, osmium, iridium, platinum, and gold. Suitable transition metals include those found in the portion of the Chemical Periodic Table as follows:

| Group    | 3 (III B) | 4 (IV B) | 5 (V B) | 6 (VI B) | 7 (VII B) | 8 (VIII B) | 9 (VIII B) | 10 (VIII B) | 11 (I B) | 12 (II B) |
|----------|-----------|----------|---------|----------|-----------|------------|------------|-------------|----------|-----------|
| Period 4 | Sc 21     | Ti 22    | V 23    | Cr 24    | Mn 25     | Fe 26      | Co 27      | Ni 28       | Cu 29    | Zn 30     |
| Period 5 | Y 39      | Zr 40    | Nb 41   | Mo 42    | Tc 43     | Ru 44      | Rh 45      | Pd 46       | Ag 47    | Cd 48     |
| Period 6 | La 57     | Hf 72    | Ta 73   | W 74     | Re 75     | Os 76      | Ir 77      | Pt 78       | Au 79    | Hg 80     |
| Period 7 | Ac 89     | Rf 104   | Db 105  | Sg 106   | Bh 107    | Hs 108     | Mt 109     | Ds 110      | Rg 111   | Uub 112   |

Suitable transition metal alloys for use as electrodes include any alloy combination of transition metals provided in the chart above.

Suitable semiconducting materials include C, Si, Ge, SiC, SiGe, AlSb, AlAs, MN, AlP, BN, BP, Bas, GaSb, GaAs, GaN, GaP, InSb, InAs, InN, InP, AlGaAs, $Al_xGa_{1-x}As$ where x is in the range of from 0 to 1, InGaAs, $In_xGa_{1-x}As$, InGaP, AlInAs, AlInSb, GaAsN, GaAsP, AlGaN, AlGaP, InGaN, InAsSb, InGaSb, AlGaInP, InAlGaP, InGaAlP, AlInGaP, AlGaAsP, InGaAsP, AlInAsP, AlGaAsN, InGaAsN, InAlAsN, GaAsSbN, GaInNAsSb, GaInAsSbP, CdSe, CdS, CdTe, ZnO, ZnSe, ZnS, ZnTe, CdZnTe, CZT, HgCdTe, HgZnTe, HgZnSe, CuCl, PbSe, PbS, PbTe, SnS, SnTe, PbSnTe, $Tl_2SnTe_5$, $Tl_2GeTe_5$, $Bi_2Te_3$, $Cd_3P_2$, $Cd_3As_2$, $Cd_3Sb_2$, $Zn_3P_2$, $Zn_3As_2$, $Zn_3Sb_2$, $PbT_2$, $MoS_2$, GaSe, SnS, $Bi_2S_3$, CIGS, PtSi, $BiI_3$, $HgI_2$, TlBr, $TiO_2$, $Cu_2O$, CuO, $UO_2$, $UO_3$, all organic semiconductors, all semiconductors that may include dilute concentrations of ferromagnetic materials and any combination thereof. Non-ferroic perovskites and metallic oxides such as $SrRuO_3$ are also included.

The semiconducting materials listed above are also suitable for the semiconducting portion of a nanoshell field effect transistor as described below and in FIG. 6. The semiconducting portion of the nanoshell field effect transistor may include the core of the device.

Electrodes on ferroelectric nanoshells may be grown, deposited or placed in contact with the ferroelectric nano surfaces in any manner providing electrical conduction between the two. In one embodiment, electrodes may also include an adhesion layer.

One or more adhesion layers may be included with an electrode. Suitable adhesion layers may comprise a transition metal or transition metal alloy, including one or more of the following, Au/Cr, Au/Ni, Au/NiCr, Au/Ti, Pt/Cr, Au/Ni, Au/NiCr, Au/Ti, Pt/Cr, Pt/Ni, Pt/NiCr, Pt/Ti, Pd/Cr, Pd/Ni, Pd/NiCr, Pd/Ti, AuPd/Cr, AuPd/Ni, AuPd/NiCr, AuPd/Ti, and the like. The aforementioned group is not meant to limit the possibilities for adhesion layer material, but merely provides a series of useful examples for the adhesion layer.

The adhesion layer may suitably be one or more layers as described above, wherein said layers are electrically contacted with the electrode and either the inner or outer surface of the ferroelectric nanoshell. The adhesion layer may be of any suitable geometry for creating an electrical contact between the electrode and the nanoshell.

In an example embodiment of nanoshell devices, one or more of the components may be disposed on a substrate. As used herein, a substrate is any suitable material for use as a substrate in the semiconductor industry, including but not limited to Si, including both n-type and p-type doped Si. The substrate may be of any geometry suitable for growth, deposition or placement of a ferroelectric nanoshell device thereon.

FIGS. 5(a)-5(f) depict one example for the manufacture of a ferroelectric device in a nanotube configuration. FIG. 5(a) depicts preparation of anodic aluminum oxide (AAO) template. FIG. 5(b) depicts sol-gel deposition and annealing to produce lead zirconate titanate (PZT) nanotubes. FIG. 5(c) depicts thermal evaporation of metal on the bottom of the AAO template and electrodeposition of a conducting core. FIG. 5(d) depicts AAO template dissolution and the co axial nanowires on an insulation substrate. FIG. 5(e) depicts removal of portions of the shell at the ends for electrical contracting. FIG. 5(f) depicts a completed structure possessing an electrically contacted core.

Ferroelectric nanoshells may be manufactured by any suitable process for the creation of a ferroelectric nanoshell. This process may include sol gel or other wet chemistry methods, wet solution based chemical synthesis, deposition methods such as sputtering, vapor deposition, ion deposition, thermal evaporation, electrodeposition, annealing and any other method present or future known in the art.

Figure 6:
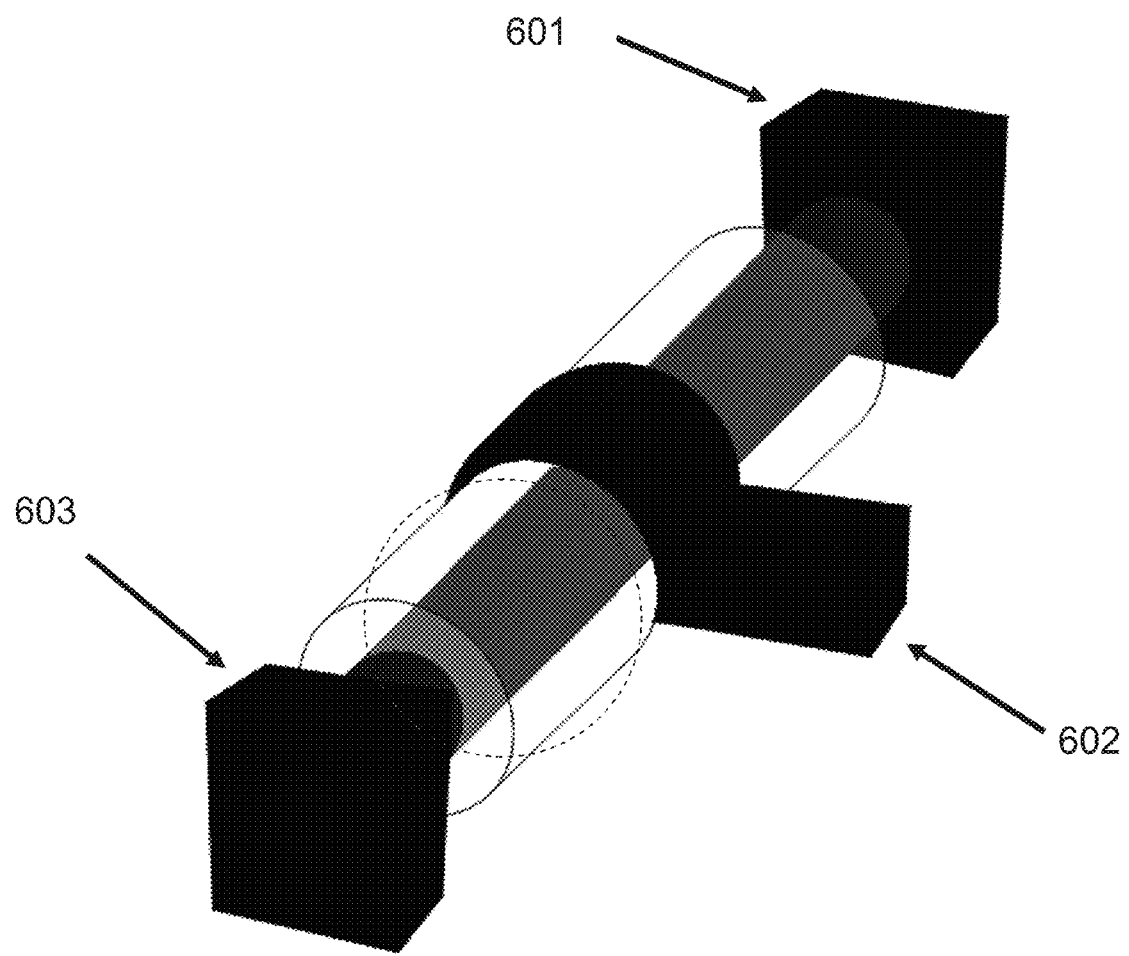
FIG. 6 depicts a geometry for a ferroelectric field effect transistor nanoshell device.

FIG. 6 depicts an example geometry for a ferroelectric field effect transistor (FFET). The FFET may include a source 603, a drain 601 and a gate 602. In the depicted embodiment, a coaxial core 604 is electrically contacted with the source 603 and drain 601. A source and drain may be in any configuration necessary to provide an electric field to one or more ferroelectric nanoshells 605 described above.

Referring to the ferroelectric field effect transistor depicted in FIG. 6, a coaxial core of the device 604 may be any material suitable for creating an electric field in a ferroelectric nanoshell 605 disposed on the core. The core, the source, the gate and the drain may be comprised of any noble metal, transition metal, transition metal alloy, semiconducting material or combination thereof.

The source, drain and gate may each further comprise an adhesion layer 606 wherein the adhesion layer comprises one or more of the following: Au/Cr, Au/Ni, Au/NiCr, Au/Ti, Pt/Cr, Au/Ni, Au/NiCr, Au/Ti, Pt/Cr, Pt/Ni, Pt/NiCr, Pt/Ti, Pd/Cr, Pd/Ni, Pd/NiCr, Pd/Ti, AuPd/Cr, AuPd/Ni, AuPd/NiCr, AuPd/Ti, or any nonferroic metallic oxide, for example, $SrRuO_3$.

Another embodiment of a ferroelectric nanoshell comprises a metal ferroelectric metal capacitor (MFMCAP). As used herein, an MFMCAP has a nanoshell with the at least two electrodes wherein the electrodes are contacted with the inner and outer surfaces of a nanoshell. The nanoshell in the MFMCAP may be comprised of one or more layers of any multiferroic material, the inner surface of the nanoshell having a radius of curvature of from 3 nm to 300 nm, and the outer surface of the nanoshell having a radius of curvature of from 5 nm to 500 nm.

Without being bound to any particular theory of operation, it is believed that the radial dependence of radial stress $\sigma_{rr}(r)$ within a shell subject to these surface tensions is of the form of a Lamé problem, and can be determined from application of radial surface boundary conditions $\sigma_{rr}(b)=\rho_{b\rho}$, $-\sigma_{rr}(a)=\rho_{a\rho}$ and application of mechanical equilibrium $\delta\sigma_{ij}/\delta x_j=0$ leading to:

$$\sigma_{rr}(r) = \frac{1}{1-(a/b)^2}\left[p_{b\rho}\left(1-\frac{a^2}{r^2}\right) + \frac{a^2}{b^2}\left(1-\frac{b^2}{r^2}\right)p_{a\rho}\right]$$

Calculation of radial polarization Pr(r, a, b) and evolution of Tc(a, b) based on stress-gradient renormalized Landau-Ginzburg formalism in thin cylindrical shell. The influence of the calculated radial stress on the ferroelectric polarization in a thin curved shell is approximated first by writing the volumetric and surface portions of the Gibbs free energy per unit length, assuming axisymmetric radial polarization:

$$G = \int_a^b \left[\frac{A}{2}P_r(r)^2 + \frac{B}{4}P_r(r)^4 + \frac{C}{6}P_r(r)^8 + \frac{1}{2}g(\nabla P_r)^2 - E_d(r)P_r(r)\right]rdr + \int_S P_r^2 dS$$

Here, $A=A_o(T-T_a)$, and $A_0$, B, and C are the Landau coefficients for $PbZr_{0.52}Ti_{0.48}O_3$, g is the extrapolation length, i.e. the energetic cost associated with variation of $P_r$ near the surface, and $E_d(r)P_r$ (r) is the depolarizing field contribution. Minimizing the free energy with respect to polarization, (ignoring domain wall contributions) and assuming that P is independent of theta and z yields the Euler-Lagrange equation $$g\nabla^2 P_r = \dot{A}P_r + BP_r^3 + CP_r^5 - E_d$$

with the renormalized coefficient, incorporating radial stress $$\dot{A}(r)=A-2Q_{12}\sigma_r(r).$$

Here $Q_{11}$ is the electrostrictive coefficient for this composition of PZT(6) ($=-4.6\times10^{-2}$ m$^4$/C$^2$). The depolarizing field Ed is approximated using the thin-film form, i.e. $E_d=\lambda P_r/\epsilon°\epsilon\zeta$ where λ is the screening length, estimated here to be 500 nm for the Pt-PZT-Au system. $P_r(p)$ was obtained by numerical integration of Eq. (S3) via a nonlinear finite-difference method, subject to electrostatic boundary conditions $$\left(\frac{dP_r}{dr} + g^{-1}P_r\right)\bigg|_{r=a} = \left(\frac{dP_r}{dr} + g^{-1}P_r\right)\bigg|_{r=b} = 0$$

where g=(1 nm) is the extrapolation length.

EXAMPLES

The following are results of tests on the effect of extreme curvature on the switching of radially-oriented ferroelectric polarizations within individual ultra-thin ferroelectric oxide perovskite nano-shells. Giant ferroelectric piezoelectric responses of up to ~200% higher than planar epitaxial films of identical thickness and composition were measured, and finite-curvature dependent asymmetry in ferroelectric switching was observed. These results are consistent with a theoretical model description incorporating nanoscale curvature and shell thickness-dependent polarization profiles. In enhancing properties along the smallest dimension, cylindrical nano-shell-based devices possessing topologically-driven strain gradients represent a model system for circumventing finite-size scaling limitations within nanostructured ferroelectric capacitors.

Reduction in film thickness of less than a few tens of nm is typically accompanied by a concomitant decrease in ferroelectric polarization P, posing significant difficulties for retaining memory storage capacity and for other functional properties in devices. However, the prevailing view of an absolute size limitation to ferroelectric stability has been re-examined in recent years with, for example, the engineering of heteroepitaxial strain via materials design, hierarchal composition, the role of surface chemical environment, new types of topologically-driven ferroelectric phases and phase transitions, and evidence for particle shape anisotropy-driven enhancements in the ferroelectric stability. The demand for progressively thinner and conformal insulating and functional films with high dielectric permittivity, for higher surface area, higher-aspect-ratio, and for higher charge capacity non-planar devices is further challenged by process-driven strain that can destabilize the ferroelectric state.

The experiments herein show the synthesis and characterization of oxide perovskite cylindrical nanoshells that are filled with noble-metal cores, a system that enables investigation of the effect of finite curvature on the scaling of ferroelectric properties along the smallest, radial dimension. Local proximal probing of individual, electrically-addressable oxide perovskite nanoshells possessing extreme curvature reveals remarkably strong and switchable radial ferroelectric polarizations. Significantly, the magnitudes of the radial ferroelectric piezoelectric responses are large and do not decrease for decreasing shell thickness and diameter. The observed suppression of the expected finite-thickness evolution of radial polarization, and the increasing coercive field and offsets in the ferroelectric hysteresis for progressively thinner shells are explained by coupling of finite diameter-dependent radial stress to radial ferroelectric polarization. The results are consistent with a theoretical model description incorporating nano-scale curvature- and shell thickness-dependent polarization profiles owing to topologically-driven strain gradients, suggesting new opportunities for nano-structured and thin-film ferroelectrics with enhanced properties based on topologically-inspired design.

A synthesis method combining sol-gel, vapor phase and electrochemical based processes that features independent control of core diameter and shell thickness was developed to produce the co-axial cylindrical multi-component nanowires. Transmission electron microscopy and indexing analysis of selected area electron diffraction collected from individual nanowires confirmed that the nanowire product possesses a distinct core and relatively uniform (~10-20%) thickness and a crystalline shell and core.

The measured variation in the ferroelectric piezoelectric responses with curvature and shell thickness reveals several noteworthy features. Shown in FIG. 7(a)-(d) are ferroelectric piezoelectric hysteresis loops, for selected PZT shells, collected on four different nanowires of selected inner radii a and shell thicknesses ζ as denoted in each plot. Locally-measured effective $d_{33}$ values in the switching in thin-film and nano-structured ferroelectrics are related to the local ferroelectric polarization through the product of the electrostriction coefficient and dielectric susceptibility, i.e. $d_{33} \approx 2Q_{11}\chi_{33}P$. Significantly, the remanent polarizations observed here do not exhibit a systematic decrease for decreasing values ζ and b, in stark contrast to previous reports of a linear reduction for logarithmically decreasing values of film thicknesses. Moreover, the response for the ζ=7 nm, a=18 nm shells is ~250% that of epitaxially-grown planar thin films of identical composition that are ~70% thicker. The present results are also noteworthy in light of the expected linear decrease in piezoelectric response in planar thin films with increasing electric field intensity.

Based on estimates of ferroelectric domains sizes induced and switched in films by a proximal probe, and noting the geometric confinement of the domain provided by the shell diameter and thickness, the smallest estimated volume for which switchable ferroelectric domains is ~6000 nm$^3$. An extrapolation of these experimental results to thinner shells possessing comparable values of $\zeta/b$ suggests that switchable and stable radial ferroelectric polarizations may be retained in thinner shells, and significantly, those situated within real metal electrodes with finite screening lengths.

Reduction in film thickness is typically accompanied also by a thickness-dependent increase in the coercive field $E_C$; this effect in films as thin as ~100 nm has been attributed to charge injection through a non-ferroelectric layer at the film/electrode interface.

Here, the shells also exhibit a remarkably large increase in $E_C$ for decreasing $\zeta$ and b, i.e. $E_C \propto \zeta^{-1}$ the extremely high measured value of Ec(~3800 kV/cm for $\zeta$=7 nm and b=25 nm) is more than three times that for a planar film of identical composition and comparable thickness, ($E_{C,film} \approx 1200$ kV/cm for 8-nm thick film) and the value of the intrinsic thermodynamic limit ($Ec_{thermo} \approx 1200$ kV/cm). The data also show curvature- and shell thickness-dependence of the horizontal and vertical offsets of the hysteresis loops.

Theoretical analysis of the radially-oriented polarization profile $P_r$ along the radius within ultra-thin, high-curvature ferroelectric shells indicates that radial ferroelectricity is thermodynamically stable, with finite diameter and shell thickness dependent enhancements in $P_r$ and $T_C$. The model description is that of a co-axial cylindrical ferroelectric capacitor comprised of a noble-metal (Au) core surrounded by ferroelectric oxide perovskite PbZr$_{0.52}$Ti$_{0.48}$O$_3$ (PZT) shell of inner and outer radii a and b, respectively, where $\rho$ and $\zeta$ are defined as the radial position within the shell $\rho$=r−a (a≤$\rho$≤b) and the shell thickness $\zeta$=b−a, respectively. Finite curvature and shell thickness dependence in the magnitude of P, for the filled cylindrical ferroelectric shell is modeled by considering the effect of radial stress owing to finite size-dependent radial pressures. With a surface tension of $\mu$=50 N/m in PbTiO$_3$ (27), $p_{b\rho}$=$\mu$/b, $p_{a\rho}$=−$\mu$/a, and the calculation of the radial dependence of the radial stress $\sigma_{rr}$(r) within the shell subject to these surface tensions is of the form of a Lamé problem.

In thin-film ferroelectric capacitors, it is well known that an in-plane compressive strain in the ferroelectric thin film near one or both of its interfaces (e.g. from heteroepitaxial or thermal strain), or a strain gradient normal to the plane of the film (e.g. from composition, thermal stresses or bending curvature) couple to P, altering its magnitude, Tc, dielectric tunability, and pyroelectric response. Here, analysis of the variation of P, and the resulting evolution of Tc in the presence of nano-shell curvature-dependent stress is carried out within the framework of the modified Landau-Ginzburg theory. The influence of the calculated radial stress on $P_r$ in a thin curved shell is approximated and used to solve numerically the resulting Euler-Lagrange equation in which a radial stress function is included in a renormalized Landau coefficient.

Remarkably, the expected finite thickness-dependent reduction in $T_C$ is completely suppressed; compared with the planar films of identical thickness, a ~200K increase in the $T_C$ for the case of the model calculations for the highest-curvature and thinnest shell nanowire is seen. The results of these model calculations are consistent with our experimental observations of ferroelectric piezoelectric response.

Although the scaling of the experimentally observed enhancement of $E_C$ with $\zeta$ is comparable to values obtained from our model calculations and based on thermodynamic ferroelectric hysteresis, the measured values are lower, suggesting that defects that relieve local stress, e.g. a curvature and shell thickness-dependent concentration of edge dislocations not accounted for in our model, may account for the difference in the barrier to switching.

Figure 7:
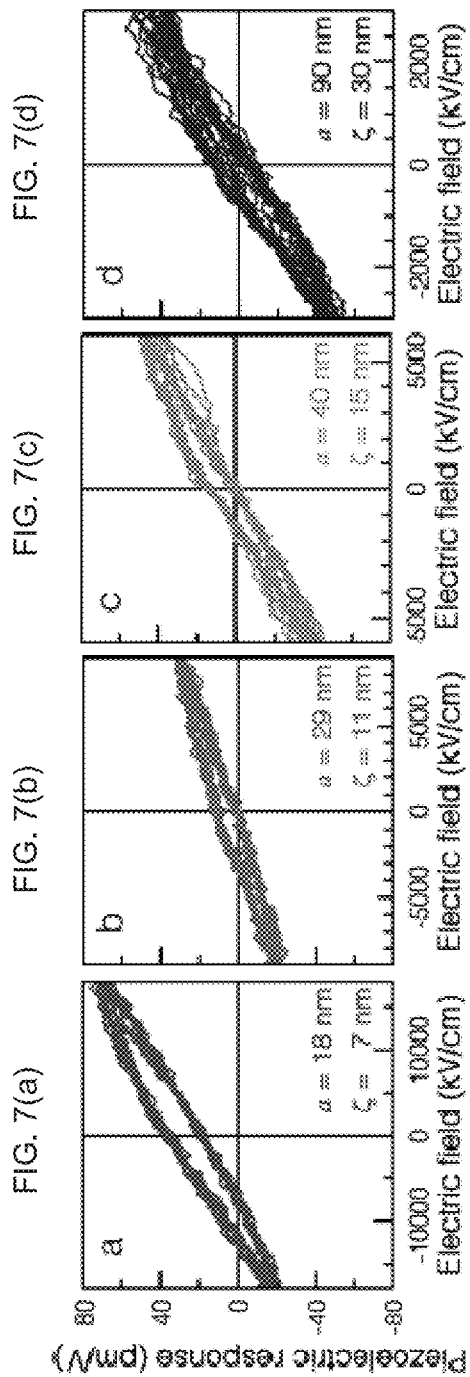
FIG. 7(a)-(d) depicts hysteresis graphs for four different ferroelectric nanoshell devices manufactured for testing.

The observed horizontal and vertical shifts in the hysteresis loops FIGS. 7(c) and (d) may be compared with those in which engineered strain, composition and/or temperature gradients in planar single and multi layer ferroelectric thin films result in polarization gradients, variations in polarization charge offset, $T_C$, and temperature-dependence of the dielectric permittivity, relevant for applications such as electric field-tunable dielectric filters. Here, electrostatic potential profiles V($\rho$) associated with inhomogeneous distribution of the stress (and therefore polarization) resulting in a bound charge density $-\rho_V = \nabla \cdot P_r$ were obtained for selected values of a and b using the calculated polarization profiles via numerically solving Poisson's equation, assuming open-circuit boundary conditions. Significantly, both the measured shifts in the ferroelectric piezoelectric hysteresis loops and the results of model calculation of offsets in polarization exhibit an increase for progressively smaller diameter and thinner shell. With the exception of the smallest-radius nano-shell, the variation in the values of the measured voltage and model-calculated potential offsets are in reasonable agreement; some of the observed difference is expected from the Au nanowire core and Pt probe tip metal work-function difference, offset by a contribution from molecular adsorbates between the Pt tip and nano-shell, and by nano-shell curvature-dependent variation in the effective contact area of the proximal probe tip with the nano-shell surface; these effects are not included in the model calculations.

An additional finite-diameter-dependent source of offset in polarization (and voltage) owing to the finite-size scaling of radial stress and resulting orthogonal strain gradient may contribute to the observed polarization. In piezoelectric materials, in addition to the coupling of a mechanical stress, an additional, but normally small contribution to dielectric or ferroelectric polarization results from a strain gradient, i.e. $P_i = d_{ijk}\sigma_{jk} + \mu_{ijkl}(\partial \epsilon_{jk}/\partial x_l)$ where $\mu_{ijkl}$ the flexoelectric tensor. An estimate of the magnitude of this effect based on our model calculations results in much larger offsets than those observed experimentally; defects may partially relieve the high radial stress (and strain gradient), thereby providing offset values that are in better agreement with the experimental results.

Finally, a surface chemical mechanism relevant to both the ferroelectric stability and offsets in the ferroelectric hysteresis response that are observed should be noted; molecular adsorbates, e.g. OH groups, can be expected to be chemisorbed on the outer surface of the nano-shells given both the nature of their synthesis and processing, and at the experimental conditions of room temperature and ambient pressure. These and other molecular adsorbates have been shown experimentally and theoretically to both stabilize ferroelectricity and to introduce asymmetry to the polarization-energy landscape, particularly in both ultra-thin films and small-diameter nanowires.

What is claimed is:

1. A method for controlling spontaneous ferroelectric polarization in a nanoshell device comprising:
applying a voltage via one or more electrodes to switch the spontaneous ferroelectric polarization of a nanoshell device,
the nanoshell device comprising an inner nanoshell surface having a radius of curvature in the range of from about 3 nm to about 300 nm,
an outer nanoshell surface having a radius of curvature in the range of from about 5 nm to about 500 nm,
a thickness between said inner nanoshell surface and said outer nanoshell surface in the range of from greater than about 1 nm to less than about 100 nm, and
wherein the ferroelectric nanoshell is characterized as being ferroelectric, ferromagnetic, or both.

2. The method of claim 1 wherein the nanoshell comprises a ferroelectric material comprising a semiconducting ferroelectric, an organic ferroelectric, a polymer ferroelectric or a metal oxide represented by the formula:

$ABO_3$ or $A_{1-x}A'_xB_{1-y}B'_yO_3$ wherein A and A' represents any element in the lanthanide, alkaline earth, or alkali metal groups and B and B' represents a transition metal, and
wherein x is in the range of from about 0 to about 1, and y is in the range of from about 0 to about 1.

3. The method of claim 2, wherein the nanoshell further comprises one or more alternating layers comprising a semiconducting ferroelectric, an organic ferroelectric, a polymer ferroelectric or an oxide composition of the formula:

$ABO_3$ or $A_{1-x}A'_xB_{1-y}B'_yO_3$ or any combination thereof, and
wherein the ferroelectric nanoshell composition is characterized as being ferromagnetic, ferroelectric, or both.

4. The method of claim 2 wherein the one or more electrodes comprises a noble metal, a transition metal, a transition metal alloy, a non-ferroic perovskite oxide or any combination thereof.

5. The method of claim 4 wherein the method is used in a ferroelectric field effect transistor.

6. The method of claim 4 wherein the method is used in a metal ferroelectric metal capacitor.

7. The ferroelectric field effect transistor of claim 5 wherein the nanoshell is in the shape of a cylinder.

8. The metal ferroelectric metal capacitor of claim 6 wherein the nanoshell is in the shape of a cylinder.

9. The ferroelectric field effect transistor of claim 5 wherein the nanoshell is a non-cylindrical tube.

10. The metal ferroelectric metal capacitor of claim 6 wherein the nanoshell is in the shape of a non-cylindrical tube.

11. The metal ferroelectric metal capacitor of claim 6 wherein the nanoshell is in the shape of a nanodot.

12. A nanoscale device, comprising:
one or more electrodes; and
one or more nanoshells comprising a ferroelectric material, the one or more nanoshells being characterized as comprising:
an inner nanoshell; and
an outer nanoshell surface having a radius of curvature in the range of from about 5 nm to about 500 nm,
the thickness between said inner nanoshell surface and said outer nanoshell surface being in the range of from greater than about 1 nm to less than about 100 nm; and
wherein the ferroelectric material is characterized as being ferroelectric, ferromagnetic, or both.

13. The nanoscale device of claim 12, wherein the ferroelectric material comprises a semiconducting ferroelectric, an organic ferroelectric, a polymer ferroelectric or a metal oxide represented by the formula:

$ABO_3$ or $A_{1-x}A'_xB_{1-y}B'_yO_3$ wherein A and A' represents any element in the lanthanide, alkaline earth, or alkali metal groups and B and B' represents a transition metal, and
wherein x is in the range of from about 0 to about 1, and y is in the range of from about 0 to about 1.

14. The nanoscale device of claim 13, wherein the nanoshell further comprises one or more alternating layers comprising a semiconducting ferroelectric, an organic ferroelectric, a polymer ferroelectric or an oxide composition of the formula:

$ABO_3$ or $A_{1-x}A'_xB_{1-y}B'_yO_3$ or any combination thereof, and
wherein the ferroelectric nanoshell composition is characterized as being ferromagnetic, ferroelectric, or both.

15. The nanoscale device of claim 13 wherein one or more electrode comprises of either a noble-metal, a transition metal, a transition metal alloy, a non-ferroic metal oxide, or any combination thereof.

16. The nanoscale device of claim 5 wherein the one or more electrodes further comprise an adhesion layer wherein the adhesion layer comprises one or more of the following: Au/Cr, Au/Ni, Au/NiCr, Au/Ti, Pt/Cr, Au/Ni, Au/NiCr, Au/Ti, Pt/Cr, Pt/Ni, Pt/NiCr, Pt/Ti, Pd/Cr, Pd/Ni, Pd/NiCr, Pd/Ti, AuPd/Cr, AuPd/Ni, AuPd/NiCr, AuPd/Ti, a non-ferroic metallic perovskite oxide, or any combination thereof.

17. A ferroelectric field effect transistor, comprising:
a source; and
a drain, wherein said source and drain are capable of providing an electric field to a ferroelectric nanoshell; and
a gate, wherein the gate is disposed on the ferroelectric nanoshell; and
one or more nanoshells comprising a ferroelectric material, the one or more nanoshells being characterized as comprising:
an inner nanoshell surface; and
an outer nanoshell surface having a radius of curvature in the range of from about 5 nm to about 500 nm, and
the thickness between said inner nanoshell surface and said outer nanoshell surface in the range of from greater than about 1 nm to less than about 100 nm; and wherein the ferroelectric nanoshell is characterized as being ferroelectric, ferromagnetic, or both.

18. The ferroelectric field effect transistor of claim 17 wherein the ferroelectric material comprises a semiconducting ferroelectric, an organic ferroelectric, a polymer ferroelectric or a metal oxide represented by the formula:

$ABO_3$ or $A_{1-x}A'_xB_{1-y}B'_yO_3$ wherein A and A' represents any element in the lanthanide, alkaline earth, or alkali metal groups and B and B' represents a transition metal, and wherein x is in the range of from about 0 to about 11, and y is in the range of from about 0 to about 1.

19. The ferroelectric field effect transistor of claim 17, wherein the nanoshell further comprises one or more alternating layers comprising a semiconducting ferroelectric, an organic ferroelectric, a polymer ferroelectric or a composition of the formula:

$ABO_3$ or $A_{1-x}A'_xB_{1-y}B'_yO_3$ or any combination thereof, and wherein the ferroelectric nanoshell composition is characterized as being ferromagnetic, ferroelectric, or both.

20. A metal ferroelectric metal device, comprising:
one or more electrodes; and
one or more nanoshells comprising a ferroelectric material, the one or more nanoshells being characterized as comprising:
an inner nanoshell surface; and
an outer nanoshell surface,
the thickness between said inner nanoshell surface and said outer nanoshell surface being in the range of from greater than about 1 nm to less than about 100 nm; and
wherein the nanoshell inner and outer surfaces are situated adjacent to the two or more electrodes; and
wherein the ferroelectric material is characterized as being ferroelectric, ferromagnetic or both.

* * * * *